US008594237B2

(12) United States Patent
Huang et al.

(10) Patent No.: US 8,594,237 B2
(45) Date of Patent: Nov. 26, 2013

(54) GFSK MODULATOR AND A METHOD FOR REDUCING RESIDUAL FREQUENCY MODULATION AND A DIGITAL ENHANCED CORDLESS TELECOMMUNICATION TRANSMITTER INCLUDING THE GFSK MODULATOR

(75) Inventors: Yiming Huang, Shanghai (CN); Ronghui Kong, Shanghai (CN); Caogang Yu, Shanghai (CN)

(73) Assignee: Beken Corporation, Shanghai (CN)

( * ) Notice: Subject to any disclaimer, the term of this patent is extended or adjusted under 35 U.S.C. 154(b) by 344 days.

(21) Appl. No.: 12/981,518

(22) Filed: Dec. 30, 2010

(65) Prior Publication Data
US 2012/0163506 A1    Jun. 28, 2012

(30) Foreign Application Priority Data
Dec. 23, 2010 (CN) .......................... 2010 1 0602472

(51) Int. Cl.
H03K 7/06 (2006.01)
(52) U.S. Cl.
USPC ........................................................ 375/303
(58) Field of Classification Search
USPC .................. 327/156, 157, 291; 329/323, 325; 348/473, 608; 370/232, 333, 347; 375/130, 219, 226, 303, 326, 327, 334, 375/340, 344, 354, 355, 375; 702/57, 66, 702/85, 89, 116
See application file for complete search history.

(56) References Cited

U.S. PATENT DOCUMENTS

| 7,224,237 B2 * | 5/2007 | Hirano et al. ................. 332/103 |
| 7,343,138 B2 * | 3/2008 | Bengtson et al. ............. 455/103 |
| 7,394,862 B2 * | 7/2008 | Jensen et al. .................. 375/272 |
| 7,397,300 B2 * | 7/2008 | Quinlan et al. ............... 329/300 |
| 8,081,936 B2 * | 12/2011 | Wang et al. ................ 455/115.1 |
| 2004/0041638 A1 * | 3/2004 | Vilcocq et al. .................. 331/16 |
| 2004/0100588 A1 * | 5/2004 | Hartson et al. ................ 348/608 |
| 2010/0171535 A1 * | 7/2010 | Shanan ........................ 327/157 |
| 2012/0082151 A1 * | 4/2012 | Liu et al. ....................... 370/342 |

FOREIGN PATENT DOCUMENTS

CN           101272142 A    9/2008

OTHER PUBLICATIONS

Shih-An Yu, et al., "A 0.65-V 2.5-GHz Fractional-N Synthesizer With Two-Point 2-Mb/s GFSK Data Modulation," Sep. 30, 2009 IEEE. vol. 44, No. 9, 2411 . . . 2424.

* cited by examiner

Primary Examiner — Sam K Ahn
Assistant Examiner — Shawkat M Ali
(74) Attorney, Agent, or Firm — Perkins Coie LLP; Aaron Wininger

(57) ABSTRACT

A GFSK modulator comprises: a first compensation module, configured to receive a GFSK pulse signal, apply a first amplitude compensation and a first delay compensation to the GFSK pulse signal, so as to generate a first compensated control signal; a second compensation module, configured to receive the GFSK pulse signal, apply a second amplitude compensation and a second delay compensation to the GFSK pulse signal, so as to generate a second compensated control signal; a closed-loop PLL module including a closed-loop PLL, configured to receive and use the first and the second compensated control signals to generate a modulated signal.

10 Claims, 8 Drawing Sheets

GFSK MODULATOR AND A METHOD FOR REDUCING RESIDUAL FREQUENCY MODULATION AND A DIGITAL ENHANCED CORDLESS TELECOMMUNICATION TRANSMITTER INCLUDING THE GFSK MODULATOR

CLAIM OF PRIORITY

This application claims priority to Chinese Application number 201010602472.6 entitled "A GFSK MODULATOR AND A METHOD FOR REDUCING RESIDUAL FREQUENCY MODULATION AND A DIGITAL ENHANCED CORDLESS TELECOMMUNICATION TRANSMITTER INCLUDING THE GFSK MODULATOR", filed on Dec. 23, 2010, which is incorporated herein by reference.

TECHNICAL FIELD

The present application relates to signal modulation, particularly to Gaussian frequency switch keying (GFSK) modulation.

BACKGROUND OF THE INVENTION

GFSK modulation is widely used in transmitters such as digital enhanced cordless telecommunication transmitters. A conventional GFSK modulator is based on an open-loop phase lock loop (PLL). However, open-loop PLLs usually have a frequency shift which can cause an increase in residual frequency modulation and worsen stability of a receiving system.

Accordingly, a GFSK modulator which is capable of controlling residual frequency modulation and ensuring stability of the receiving system is desirable.

BRIEF DESCRIPTION OF THE INVENTION

According to an embodiment of the invention, a GFSK modulator comprises: a first compensation module, configured to receive a GFSK pulse signal, apply a first amplitude compensation and a first delay compensation to the GFSK pulse signal, so as to generate a first compensated control signal; a second compensation module, configured to receive the GFSK pulse signal, apply a second amplitude compensation and a second delay compensation to the GFSK pulse signal, so as to generate a second compensated control signal; a closed-loop PLL module configured to receive and use the first and the second compensated control signals to generate a modulated signal.

According to an embodiment of the invention, a method for GFSK modulation comprises: receiving a GFSK pulse signal with a GFSK modulator, the GFSK modulator comprises: a first compensation module configured to receive a GFSK pulse signal, apply a first amplitude compensation and a first delay compensation to the GFSK pulse signal, so as to generate a first compensated control signal; a second compensation module, configured to receive the GFSK pulse signal, apply a second amplitude compensation and a second delay compensation to the GFSK pulse signal, so as to generate a second compensated control signal; a closed-loop PLL module configured to receive and use the first and the second compensated control signals to generate a modulated signal; and performing GFSK modulation on the received GFSK pulse signal with the GFSK modulator.

According to an embodiment of the invention, a transmitter comprises: comprising a GFSK modulator, the GFSK modulator comprises: a first compensation module, configured to receive a GFSK pulse signal, apply a first amplitude compensation and a first delay compensation to the GFSK pulse signal, so as to generate a first compensated control signal; a second compensation module, configured to receive the GFSK pulse signal, apply a second amplitude compensation and a second delay compensation to the GFSK pulse signal, so as to generate a second compensated control signal; a closed-loop PLL module configured to receive and use the first and the second compensated control signals to generate a modulated signal.

The GFSK modulator according to embodiments of the invention can limit residual frequency modulation well with substantially no frequency drift. In addition, the GFSK modulator has satisfying stability and can be beneficial to lower power consumption.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-know structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Generally, a residual frequency modulation includes two parts: $F_{nPLL}$ caused by phase noise of a PLL and $F_{nMOD}$ caused by GFSK modulation itself. In the description below, it will be discussed how to limit $F_{nMOD}$.

Figure 1:
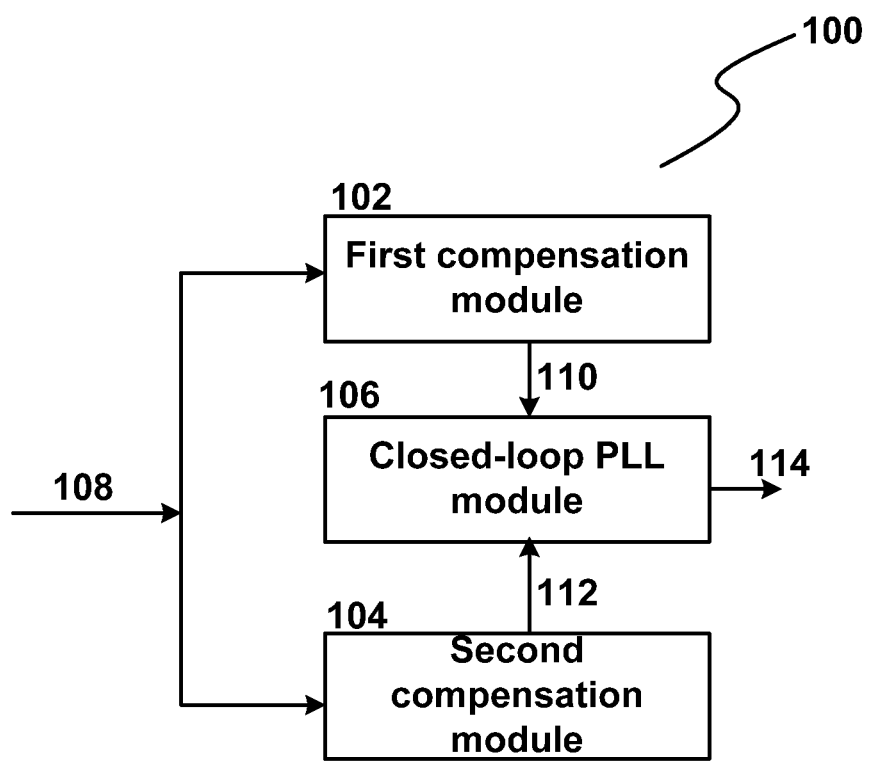
FIG. 1 is a block diagram illustrating a GFSK modulator according to an embodiment of the invention.

FIG. 1 is a block diagram illustrating a GFSK modulator 100 according to an embodiment of the invention. As illustrated, the GFSK modulator 100 includes a first compensation module 102, a second compensation module 104 and a closed-loop PLL module 106. Generally, a GFSK pulse generator (not shown) is provided to generate a GFSK pulse signal 108. The first compensation module 102 receives the GFSK pulse signal 108, applies a first amplitude compensation G1 and a first delay compensation D1 to the GFSK pulse signal 108, so as to generate a first compensated control signal 110. The second compensation module 104 also receives the GFSK pulse signal 108, applies a second amplitude compensation G2 and a second delay compensation D2 to the GFSK pulse signal 108, so as to generate a second compensated control signal 112. Further, the closed-loop PLL module 106, which includes a closed-loop PLL, receives and uses the first compensated control signal 110 and the second compensated control signal 112 to generate a modulated signal 114.

Figure 2:
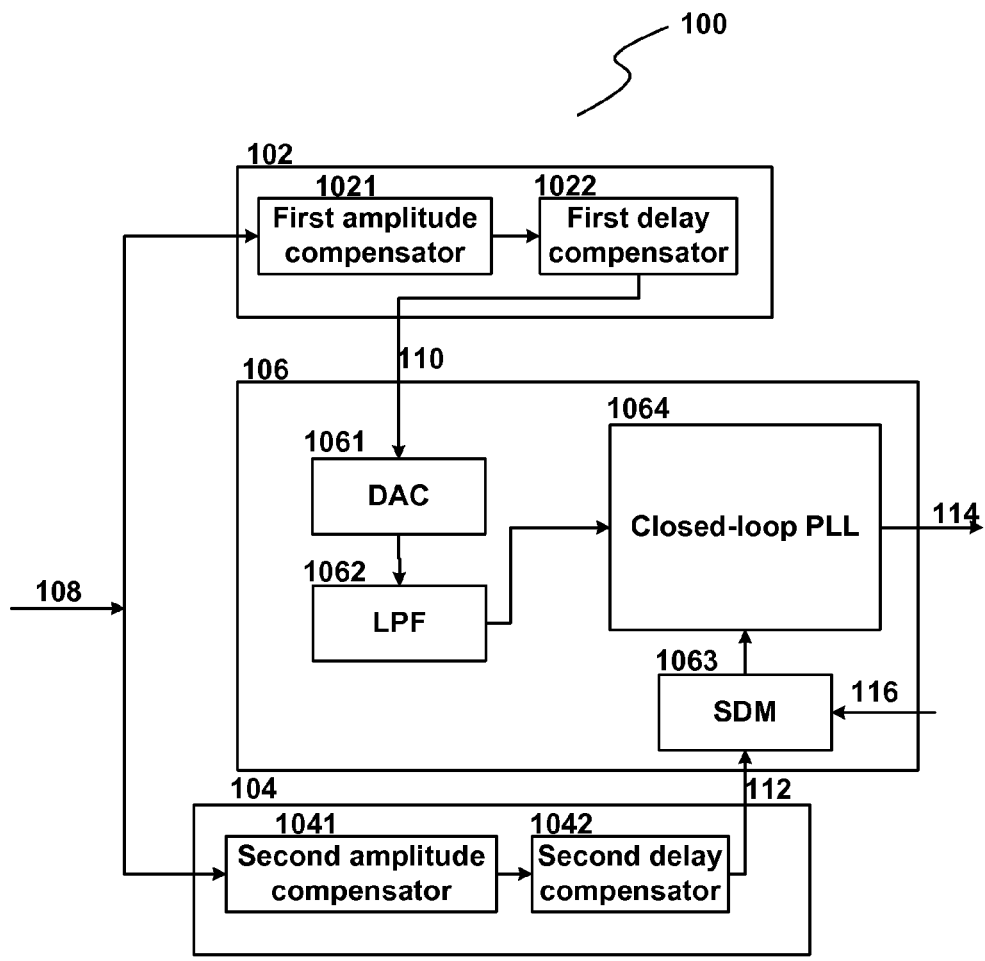
FIG. 2 is a detailed view of the GFSK modulator as illustrated in FIG. 1.

FIG. 2 is a detailed view of the GFSK modulator as illustrated in FIG. 1. Specifically, the first compensation module 102 includes a first amplitude compensator 1021 configured to apply the first amplitude compensation G1 to the GFSK pulse signal 108, i.e., adjust an amplitude thereof. A value range of G1 (G1 may change within this value range) determines modulation deviation of the first compensation module 102, a change precision of G1 corresponds to a compensation precision of an amplitude balance of the first compensation module 102. A first delay compensator 1022 in the first compensation module 102 is configured to apply the first delay compensation D1 to the GFSK pulse signal 108. A value range of D1 determines a delay compensation range of the first compensation module 102, a change precision of D1 corresponds to a compensation precision of a delay balance of the first compensation module 102. The first compensated control signal 110 is hence generated with G1 and D1 applied thereto. In an embodiment of the invention, the first delay compensator 1022 can be arranged to receive the GFSK pulse signal 108 directly and then forward the GFSK pulse signal 108 with D1 applied to the first amplitude compensator 1021.

Still as illustrated in FIG. 2, the second compensation module 104 includes a second amplitude compensator 1041 configured to apply the second amplitude compensation G2 to the GFSK pulse signal 108, i.e., adjust an amplitude thereof. A value range of G2 (G2 may change within this value range) determines modulation deviation of the second compensation module 104, a change precision of G2 corresponds to a compensation precision of an amplitude balance of the second compensation module 104. A second delay compensator 1042 in the second compensation module 104 is configured to apply the second delay compensation D2 to the GFSK pulse signal 108. A value range of D2 determines a delay compensation range of the second compensation module 104, a change precision of D2 corresponds to a compensation precision of a delay balance of the second compensation module 104. The second compensated control signal 112 is hence generated with G2, D2 applied thereto. In an embodiment of the invention, the second delay compensator 1042 can be arranged to receive the GFSK pulse signal 108 directly and then forward the GFSK pulse signal 108 with D2 applied to the second amplitude compensator 1041.

As illustrated in FIG. 2, the closed-loop PLL module 106 includes a digital-to-analog converter (DAC) 1061, a first low pass filter (LPF) 1062, a sigma delta modulator (SDM) 1063 and a closed-loop PLL 1064.

Specifically, the DAC 1061 receives and converts the first compensated control signal 110 into an analog signal (also referred to as an analog GFSK signal) which is then forwarded to the first LPF 1062. The first LPF 1062 filters quantized noise and overlap interference from the analog signal so as to generate a first control signal. Further reference will be made to the first control signal in detail below.

The SDM 1063 is configured to receive and use the second compensated control signal 112 and a reference signal (not shown) to generate a second control signal. Further reference will be made to the second control signal in detail below.

The closed-loop PLL 1064 is configured to receive the first control signal and the second control signal and generate the modulated signal 114 controlled by the first and the second control signal. Further reference will be made to the closed-loop PLL 1064 below by referring to FIG. 3.

Figure 3:
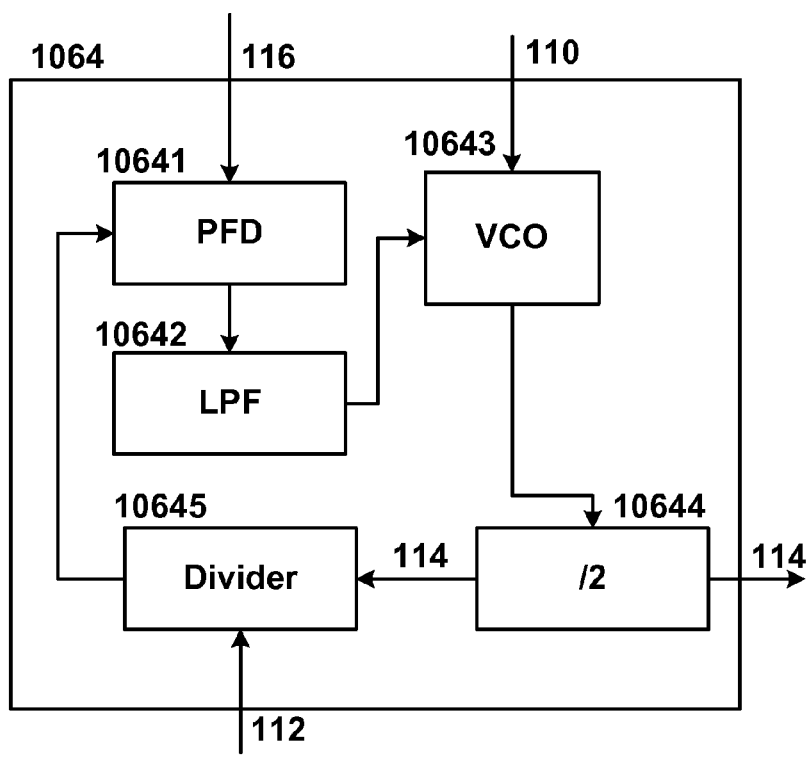
FIG. 3 is a detailed view of the closed loop PLL as illustrated in FIG. 2.

FIG. 3 is a detailed view of the closed-loop PLL as illustrated in FIG. 2. The closed-loop PLL (hereinafter referred to as PLL) 1064 includes a phase frequency detector (PFD) 10641 configured to receive the reference signal 116 and a feedback signal, detect a frequency difference and a phase difference between the reference signal 116 and the feedback signal, generate a detection signal denoting the frequency difference and the phase difference. According to an embodiment of the invention, the detection signal is a voltage signal. The PFD 10641 forwards the generated detection signal to a second LPF 10642 which then performs a low pass filtering on the detection signal so as to generate a filtered signal.

The filtered signal is then forwarded by the second LPF 10642 to a voltage control oscillator (VCO) 10643 to control an output of the VCO 10643.

The VCO 10643 also receives the first control signal 110 as mentioned above, and uses the filtered signal and the first control signal to generate an oscillation signal. The VCO 10643 then forwards the generated oscillation signal to a first divider 10644 which divides a frequency of the oscillation signal by 2 so as to generate the modulated signal 114. Besides, the first divider 10644 also forwards the modulated signal 114 to a second divider 10645.

The second divider 10645 also receives the second control signal 112 as discussed above and uses the second control signal 112 and the modulated signal 10644 to generate the feedback signal.

As can be seen from the description above, a closed-loop PLL is hence formed with substantially no frequency drift.

As mentioned above, G1, D1, G2 and D2 can lower residual frequency modulation for the GFSK modulator 100 so as to improve the modulation quality. The higher the change precision of the four parameters (G1, D1, G2, D2) is, the lower the residual frequency modulation will be. Noting a bit-width of the DAC 1061 and an area of the GFSK modulator 100 increase with the change precision, it will be discussed how to determine G1, D1, G2 and D2 according to a desirable residual frequency modulation of the GFSK modulator 100.

Figure 4:
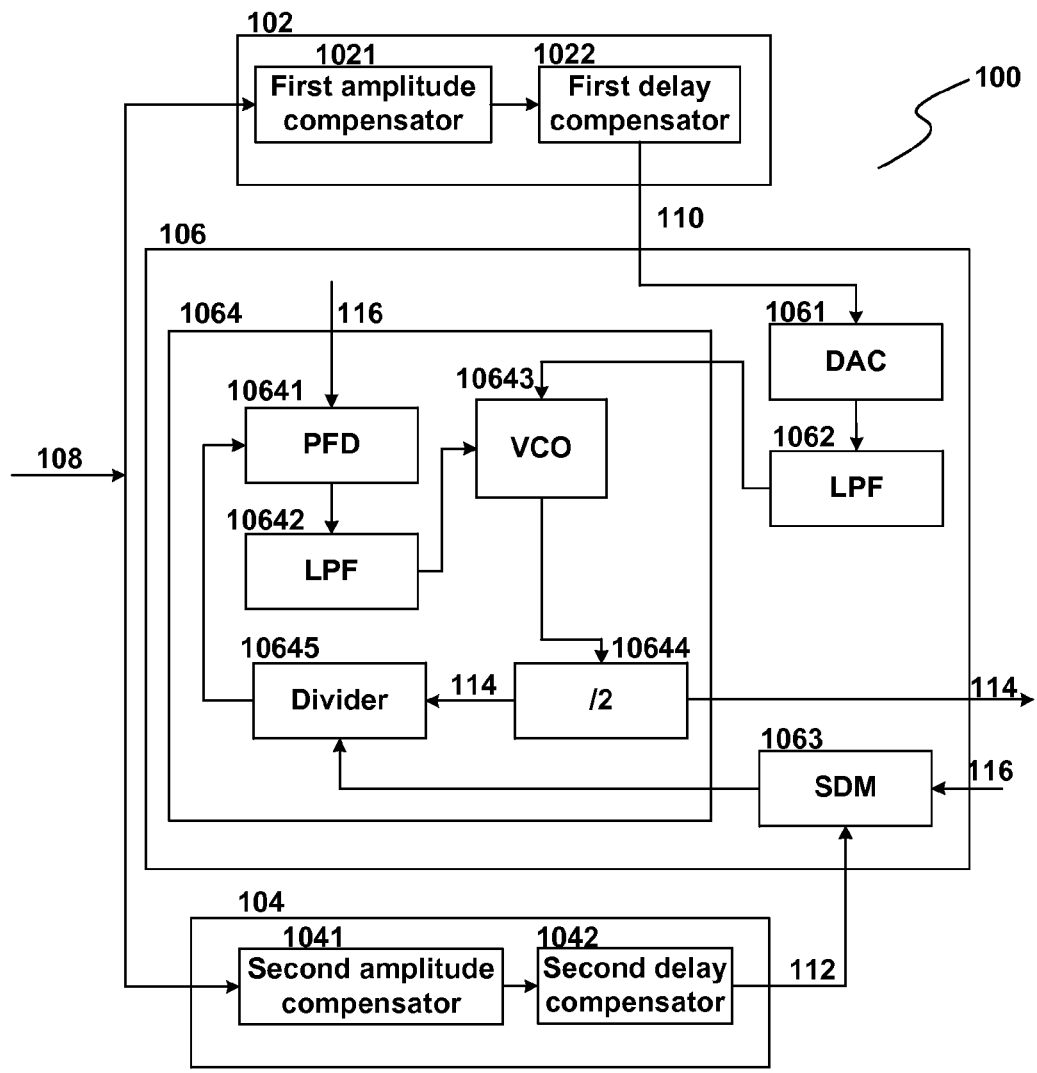
FIG. 4 is a detailed view of the GFSK modulator as illustrated in FIG. 2 including a closed-loop PLL as illustrated in FIG. 3.
Figure 5:
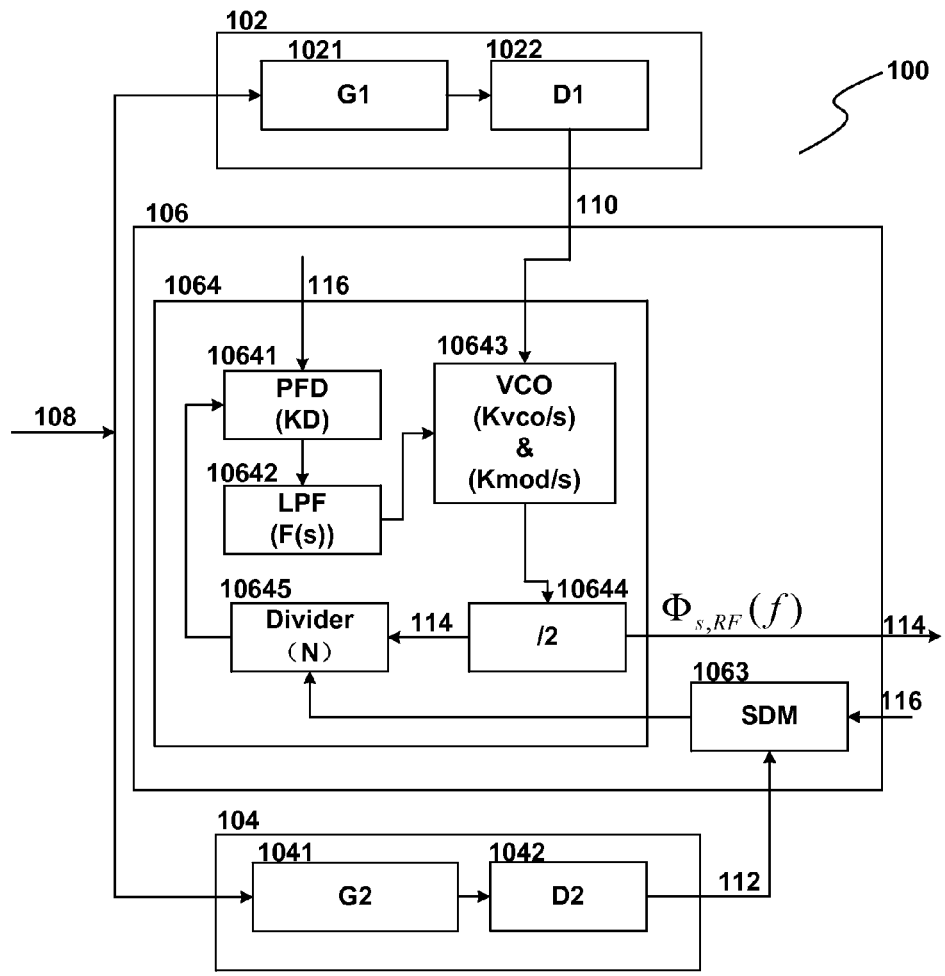
FIG. 5 is another view of the GFSK modulator in FIG. 4.

FIG. 4 is a detailed view of the GFSK modulator 100 in FIG. 2 including a closed-loop PLL as illustrated in FIG. 3. FIG. 5 is another view of the GFSK modulator 100 as illustrated in FIG. 4. In FIG. 5, some components are marked with their key parameters. For example, the first compensator 1021 is marked with G1, the VCO 10643 is marked with Kvoc/s and Kmod/s, the modulated signal 114 is marked with $\phi_{s,RF}$ (f).

Figure 6:
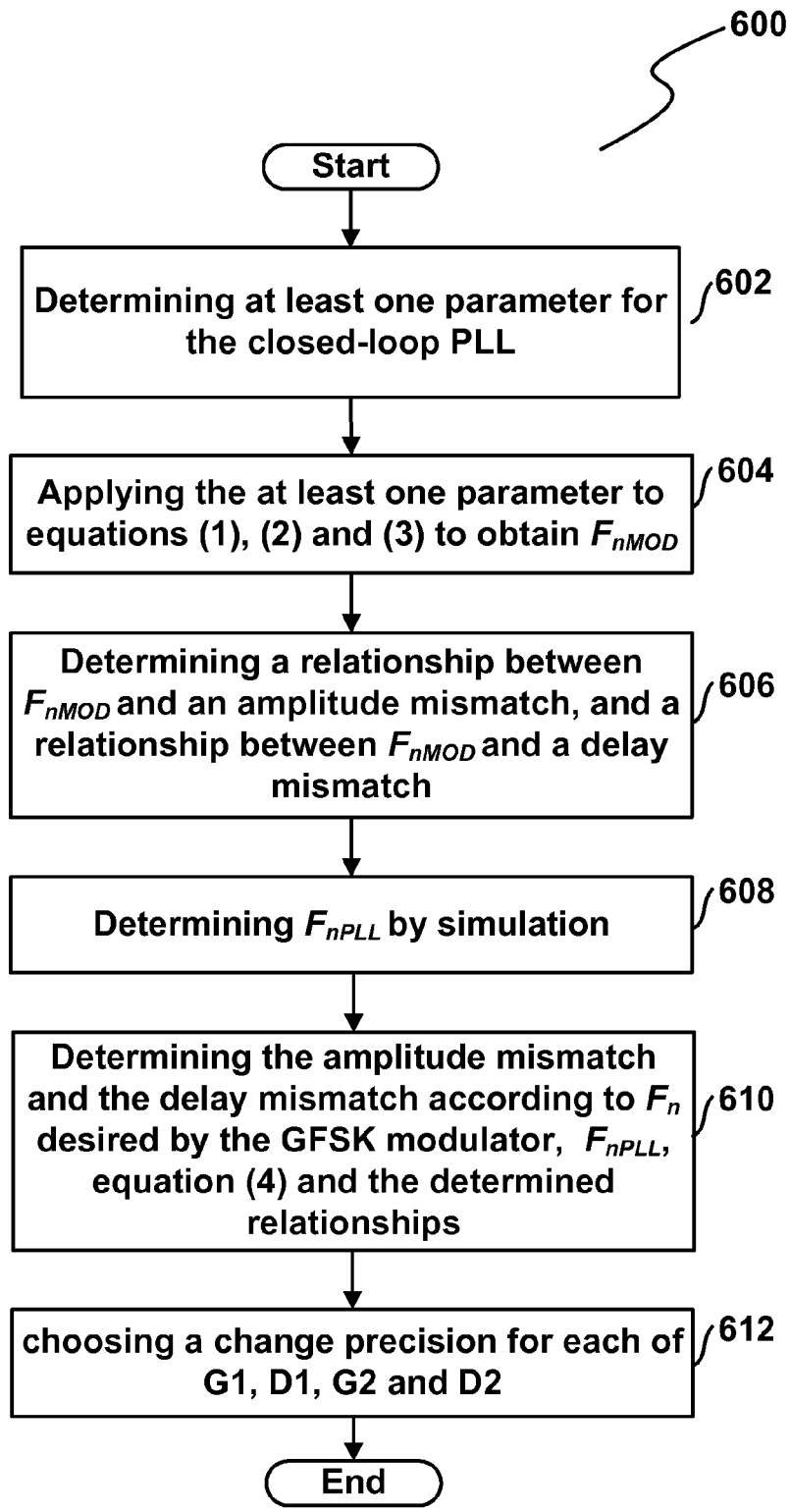
FIG. 6 is a flowchart of a method for determining parameters for a GFSK modulator according to an embodiment of the invention.

Reference will be made to a procedure for determining at least one parameter for the GFSK modulator 100 by referring to FIGS. 5 and 6.

Refer to FIG. 5, Kd is a current gain of PFD 10641, Kmod is a modulation voltage gain of VCO 10643, Kvco is a loop voltage gain of VCO 10643, F(s) is a frequency transmission function for LPF 10642, $\rho_{s,BB}$(f) is a frequency response corresponding to a GFSK pulse signal after a GFSK pulse formation based on a base-band signal. Based on basic theories of PLLs, equations (1) and (2) can be derived as following:

A system function for a forward path:

$$A(s) = \frac{Kvco \cdot Kd \cdot F(s)}{s} \quad (1)$$

A system function for a feedback path:

$$H(s) = \frac{1}{2N} \quad (2)$$

where s=j*2πf, the second divider 10645 divides a frequency of the modulated signal 114 by N.

According to a Mason's gain formula of the GFSK modulator 100 illustrated in FIG. 5, it can be seen that if G1·K mod=2·G2·$F_{ref}$ and D1=D2; the modulated signal 114, which is a radio frequency (RF) phase signal will have a frequency response $\phi_{s,RF}(f)$ independent from any parameter of the closed-loop PLL 1064. Therefore, even though a bit rate of the signal 108 is much higher than a bandwidth of the PLL 1064, the signal 108 can still be converted to RF band without distortion. In other words, $F_{nMOD}$ is 0. As digital enhanced cordless telecommunication always transmit at a rate of 1.152 Mbps, while a bandwidth of a PLL is typically about 100 KHz, the modulation discussed above has an acceptable error rate. In addition, as a closed-loop PLL is adopted, the GFSK modulator 100 no longer suffers from any frequency drift. Furthermore, as long as a transmitter such as a digital enhanced cordless telecommunication transmitter is equipped with the GFSK modulator 100 as discussed above, the PLL 1064 can be shared by a receiver at the telecommunication system.

In practical system design, it is possible that G1·K mod≠2·G2·Fref, and D1≠D2. With the aid of G1, D1, G2 and D2, $F_{nMOD}$ can be controlled.

Let 2·G2·Fref=(1+ΔG)·(G1·K mod), D2=D1−ΔD, where ΔG is referred to as an amplitude mismatch, ΔD is referred to as a delay mismatch.

According to a Meson's gain formula of the GFSK modulator 100 in FIG. 5, $F_{nMOD}$ can be represented by equation (3):

$$F_{nMOD} = \quad (3)$$
$$std\left(\Delta F_{MOD} * abs\left(\frac{1}{1+A(s)\cdot H(s)} + \frac{(1+\Delta G)\cdot \exp^{s\Delta D}\cdot A(s)\cdot H(s)}{1+A(s)\cdot H(s)}\right)\right) =$$
$$std\left(\Delta F_{MOD} * abs\left(\frac{1}{1+A(j*2\pi f)\cdot H(j*2\pi f)} + \right.\right.$$
$$\left.\left.\frac{(1+\Delta G)\cdot \exp^{j*2\pi f\cdot \Delta D}\cdot A(j*2\pi f)\cdot H(j*2\pi f)}{1+A(j*2\pi f)\cdot H(j*2\pi f)}\right)\right)$$

Where "exp" is an exponential function, "abs" means to calculate an absolute value, "std" is a standard deviation, and "f" takes a value in $$0 \sim \frac{B_{rf}}{2},$$

$B_{rf}$ is a bandwidth of the RF signal.

A change precision of each of G1, D1, G2 and D2 can be determined through a procedure as discussed below with reference to FIG. 6.

Block 602

In a transmission system such as a digital enhanced cordless telecommunication system according to an embodiment of the invention, parameters of the closed-loop PLL 1064 may be as follows:

$Kd = 0.0003(V/2\pi)$, $Kvco = 23(MHz \cdot 2\pi/V)$, $N = 140$, $F_{ref} = 13.824$ MHz, $$F(s) = \frac{(1+9\cdot 10^{-6}\cdot s)}{3.6\cdot 10^{-23}\cdot s^3 + 3.04\cdot 10^{-16}\cdot s^2 + 3.2\cdot 10^{-10}\cdot s},$$

$B_{rf} = 1.3$ MHz.

Blocks 604, 606

Figure 7:
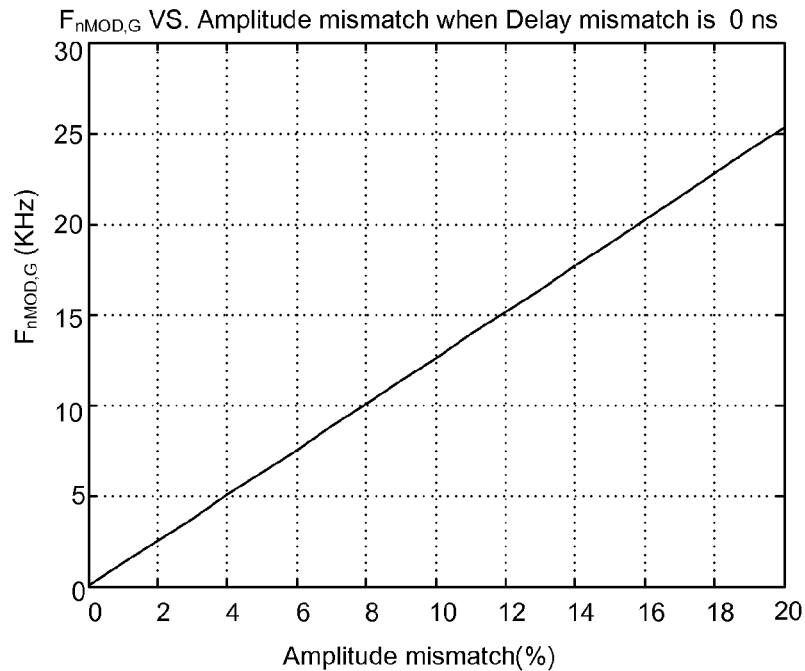
FIG. 7 is a drawing illustrating a relationship between a residual frequency modulation and an amplitude mismatch.
Figure 8:
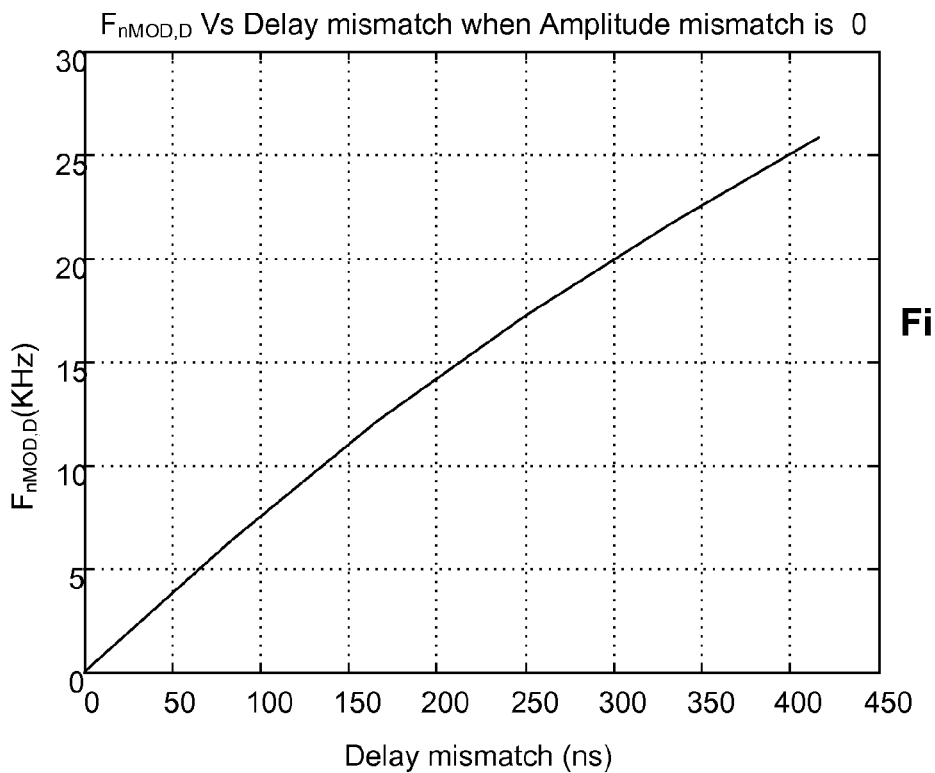
FIG. 8 is a drawing illustrating a relationship between a residual frequency modulation and a delay mismatch.

By applying the parameters above and $\Delta F_{MOD}$ of GFSK with 288 KHz to equations (1), (2) and (3), a relationship between the amplitude mismatch and $F_{nMOD,\Delta G}$ when ΔD=0, a relationship between the delay mismatch and $F_{nMOD,\Delta D}$ when ΔG=0 can be also determined as illustrated in FIGS. 7 and 8.

Consider a phase noise, an actual residual frequency modulation of the GFSK modulator 100 is:

$$F_n = \sqrt{F_{nPLL}^2 + F_{nMOD,\Delta G}^2 + F_{nMOD,\Delta D}^2} \quad (4)$$

where $F_{nPLL}$ is determined by the PLL 1064 and can be obtained by simulation (block 608). In a digital enhanced cordless telecommunication, $F_n$ is generally required to be no more than 15 KHz. By simulation, the $F_{nPLL}$ is about 10 KHz.

Block 610

By applying $F_n$ and $F_{nPLL}$ into equation (4), and according to FIGS. 7, 8, three sets of ΔG and ΔD satisfying requirements can be calculated, as listed in

TABLE 1

| Calculated ΔG and ΔD | | |
|---|---|---|
| ΔG (%) 7 | 8 | 8.5 |
| ΔD (ns) 100 | 50 | 25 |

Block 612

Reference signal 116 has a typical frequency of 13.824 MHz and can be easily procured and used as a sampling clock signal. The sampling clock signal has a sampling interval of 72 ns which is longer than last two combinations in Table 1, i.e., (8, 50) and (8.5, 25). Accordingly, according to an embodiment of the invention, the first combination, i.e., (7, 100) is chosen.

In view of system redundancy, an exemplary change precision of each of G1 and G2 shall be less than the chosen ΔG, an exemplary change precision of each of D1 and D2 shall be shorter than the chosen ΔD. According to an embodiment of the invention, the change precision of each of G1 and G2 is determined as 3.13%, the change precision of each of D1 and D2 is determined as 72 ns.

Accordingly, a bit-width of the DAC can be 6 bits and the reference signal can be used directly as the sampling clock signal of the system. This may be propitious to the following: (a) limit the area of the DAC and associated digital circuit; (b) simplify the system; and (c) meet the requirements regarding residual modulation.

Figure 9:
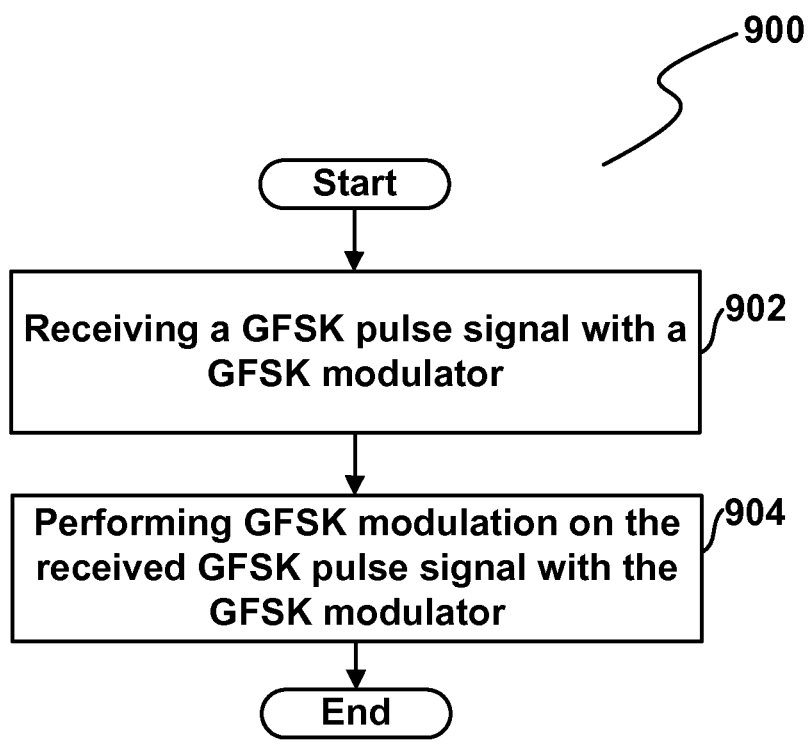
FIG. 9 is a flowchart of a method for GFSK modulation according to an embodiment of the invention.

FIG. 9 is a flowchart of a method 900 for GFSK modulation according to an embodiment of the invention. At block 902, a GFSK modulator 100 as discussed above receives a GFSK pulse signal 108 as discussed above. At block 904, the GFSK modulator 100 performs a GFSK modulation on the received GFSK pulse signal 108.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A Gaussian Frequency Switch Keying (GFSK) modulator, comprising: a first compensation module, configured to receive a GFSK pulse signal, apply a first amplitude compensation and a first delay compensation to the GFSK pulse signal, so as to generate a first compensated control signal; a second compensation module, configured to receive the GFSK pulse signal, apply a second amplitude compensation and a second delay compensation to the GFSK pulse signal, so as to generate a second compensated control signal; a closed-loop Phase Lock Loop (PLL) module configured to receive and use the first and the second compensated control signals to generate a modulated signal; the GFSK modulator further configured to: determine at least one parameter for the closed-loop PLL module; use the determined at least one parameter to calculate a residual frequency modulation of the GFSK modulation; determine a relationship between the residual frequency modulation of the GFSK modulation and an amplitude mismatch; determine a relationship between the residual frequency modulation of the GFSK modulation and a delay mismatch; determine a residual frequency modulation of the closed-loop PLL module; determine the amplitude mismatch and the delay mismatch according to a residual frequency modulation desired by the GFSK modulator, the residual frequency modulation of the closed-loop PLL module and the determined relationships; and choose a change precision for each of the first amplitude compensation, the second amplitude compensation, the first delay compensation and the second delay compensation.

2. The GFSK modulator of claim 1, wherein the first compensation module includes:
a first amplitude compensator configured to apply the first amplitude compensation to the GFSK pulse signal; and
a first delay compensator configured to apply the first delay compensation to the GFSK pulse signal;
the second compensation module includes:
a second amplitude compensator configured to apply the second amplitude compensation to the GFSK pulse signal; and
a second delay compensator configured to apply the second delay compensation to the GFSK pulse signal.

3. The GFSK modulator of claim 1, wherein the closed-loop PLL module includes:
a digital-to-analog converter configured to receive and convert the first compensated control signal into an analog signal;
a first low pass filter configured to receive and filter the analog signal to generate a first control signal;
a sigma delta modulator configured to receive and use the second compensated control signal and a reference signal to generate a second control signal;
a closed-loop PLL configured to receive the first and the second control signal and generate a modulated signal controlled by the first and the second control signal.

4. The GFSK modulator of claim 3, wherein the closed-loop PLL comprises:
a phase frequency detector configured to receive the reference signal and a feedback signal, detect a frequency difference and a phase difference between the reference signal and the feedback signal, generate a detection signal denoting the frequency difference and the phase difference;
a second low pass filter, configured to receive and filter the detection signal to generate a filtered signal;
a voltage control oscillator, configured to receive and use the filtered signal and the first control signal to generate an oscillation signal;
a first divider configured to receive the oscillation signal and divide a frequency of the oscillation signal by 2 so as to generate the modulated signal;
a second divider configured to receive and use the modulated signal and the second control signal to generate the feedback signal.

5. A method for Gaussian frequency switch keying (GFSK) modulation, comprising: receiving a GFSK pulse signal with a GFSK modulator, the GFSK modulator comprising: a first compensation module receiving the GFSK pulse signal, applying a first amplitude compensation and a first delay compensation to the GFSK pulse signal, so as to generate a first compensated control signal; a second compensation module, receiving the GFSK pulse signal, applying a second amplitude compensation and a second delay compensation to the GFSK pulse signal, so as to generate a second compensated control signal; a closed-loop Phase Lock Loop (PLL) module receiving and using the first and the second compensated control signals to generate a modulated signal; and performing GFSK modulation on the received GFSK pulse signal with the GFSK modulator; wherein the closed-loop PLL module including: a digital-to-analog converter receiving and converting the first compensated control signal into an analog signal; a first low pass filter receiving and filtering the analog signal to generate a first control signal; a sigma delta modulator receiving and using the second compensated control signal and a reference signal to generate a second control signal; a closed-loop PLL receiving the first and the second control signal and generating a modulated signal controlled by the first and the second control signal.

6. The method of claim 5, wherein the first compensation module including: a first amplitude compensator applying the first amplitude compensation to the GFSK pulse signal; and a first delay compensator applying the first delay compensation to the GFSK pulse signal; the second compensation module includes: a second amplitude compensator applying the second amplitude compensation to the GFSK pulse signal; and a second delay compensator applying the second delay compensation to the GFSK pulse signal.

7. The method of claim 5, wherein the closed-loop PLL comprising: a phase frequency detector receiving the reference signal and a feedback signal, detecting a frequency difference and a phase difference between the reference signal and the feedback signal, generating a detection signal denoting the frequency difference and the phase difference; a second low pass filter, receiving and filtering the detection signal to generate a filtered signal; a voltage control oscillator, receiving and using the filtered signal and the first control signal to generate an oscillation signal; a first divider receiving the oscillation signal and dividing a frequency of the oscillation signal by 2 so as to generate the modulated signal; a second divider receiving and using the modulated signal and the second control signal to generate the feedback signal.

8. The method of claim 5, wherein the GFSK modulator further comprises a processor configured to perform the following procedure:

determining at least one parameter for the closed-loop PLL module;

using the determined at least one parameter to calculate a residual frequency modulation of the GFSK modulation;

determining a relationship between the residual frequency modulation of the GFSK modulation and an amplitude mismatch;

determining a relationship between the residual frequency modulation of the GFSK modulation and a delay mismatch;

determining a residual frequency modulation of the closed-loop PLL module;

determining the amplitude mismatch and the delay mismatch according to a residual frequency modulation desired by the GFSK modulator, the residual frequency modulation of the closed-loop PLL module and the determined relationships; and choosing a change precision for each of the first amplitude compensation, the second amplitude compensation, the first delay compensation and the second delay compensation.

9. A transmitter comprising a Gaussian frequency switch keying (GFSK) modulator, the GFSK modulator comprising: a first compensation module, configured to receive a GFSK pulse signal, apply a first amplitude compensation and a first delay compensation to the GFSK pulse signal, so as to generate a first compensated control signal; a second compensation module, configured to receive the GFSK pulse signal, apply a second amplitude compensation and a second delay compensation to the GFSK pulse signal, so as to generate a second compensated control signal; a closed-loop Phase Lock Loop (PLL) module configured to receive and use the first and the second compensated control signals to generate a modulated signal; wherein the GFSK modulator further configured to: determine at least one parameter for the closed-loop PLL module; use the determined at least one parameter to calculate a residual frequency modulation of the GFSK modulation; determine a relationship between the residual frequency modulation of the GFSK modulation and an amplitude mismatch; determine a relationship between the residual frequency modulation of the GFSK modulation and a delay mismatch; determine a residual frequency modulation of the closed-loop PLL module; determine the amplitude mismatch and the delay mismatch according to a residual frequency modulation desired by the GFSK modulator, the residual frequency modulation of the closed-loop PLL module and the determined relationships; and choose a change precision for each of the first amplitude compensation, the second amplitude compensation, the first delay compensation and the second delay compensation.

10. The transmitter of claim 9, wherein the first compensation module includes:

a first amplitude compensator configured to apply the first amplitude compensation to the GFSK pulse signal; and a first delay compensator configured to apply the first delay compensation to the GFSK pulse signal;

the second compensation module includes:

a second amplitude compensator configured to apply the second amplitude compensation to the GFSK pulse signal; and a second delay compensator configured to apply the second delay compensation to the GFSK pulse signal.

\* \* \* \* \*